(12) United States Patent
Liu et al.

(10) Patent No.: US 8,411,217 B2
(45) Date of Patent: Apr. 2, 2013

(54) ACTIVE DEVICE ARRAY SUBSTRATE WITH PROTECTING ELECTROSTATIC DISCHARGE CIRCUIT HAVING SWITCHING DEVICES

(75) Inventors: Wen-Hsiung Liu, Pingtung County (TW); Chien-Kuo He, Taipei County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 734 days.

(21) Appl. No.: 12/144,655

(22) Filed: Jun. 24, 2008

(65) Prior Publication Data
US 2009/0014726 A1 Jan. 15, 2009

(30) Foreign Application Priority Data
Jul. 12, 2007 (TW) .............................. 96125385 A

(51) Int. Cl.
*G02F 1/1333* (2006.01)
*G02F 1/136* (2006.01)
*G02F 1/1345* (2006.01)
*G09G 3/36* (2006.01)
*H01L 29/04* (2006.01)

(52) U.S. Cl. ................ 349/40; 349/41; 349/42; 349/43; 345/92; 345/104; 257/59; 257/72

(58) Field of Classification Search .............. 349/40–47, 349/149, 150–152; 345/92, 104; 257/59, 257/72
See application file for complete search history.

(56) References Cited

U.S. PATENT DOCUMENTS

| 5,019,002 | A |   | 5/1991  | Holmberg |
|-----------|---|---|---------|----------|
| 5,646,548 | A | * | 7/1997  | Yao et al. ........................ 326/80 |
| 5,726,720 | A | * | 3/1998  | Watanabe et al. ............... 349/43 |
| 5,828,428 | A | * | 10/1998 | Kim et al. ....................... 349/40 |
| 6,072,550 | A | * | 6/2000  | Kim ................................. 349/40 |
| 6,104,449 | A | * | 8/2000  | Takahashi et al. .............. 349/40 |
| 2006/0145951 | A1 | * | 7/2006 | Watanabe et al. ............... 345/55 |

* cited by examiner

*Primary Examiner* — Hoan C Nguyen
(74) *Attorney, Agent, or Firm* — Jianq Chyun IP Office

(57) ABSTRACT

An active device array substrate including a substrate, a pixel array, pads, first switching devices, and second switching devices is provided. The pixel array is disposed on a display region of the substrate. The pads, the first and the second switching devices are disposed on a peripheral circuit region of the substrate. The pads and the pixel array are electrically connected. The first and the second switching devices are at the outside of the pads. Each first switching device is electrically connected to one of the pads and has a source, a drain, and a gate electrically connected to the source and the pad. Each second switching device is electrically connected to two adjacent first switching devices and has a gate, a source, and a drain. The source and the drain are electrically connected to the drain and the source of the adjacent first switching device, respectively.

4 Claims, 16 Drawing Sheets

ACTIVE DEVICE ARRAY SUBSTRATE WITH PROTECTING ELECTROSTATIC DISCHARGE CIRCUIT HAVING SWITCHING DEVICES

CROSS-REFERENCE TO RELATED APPLICATION

This application claims the priority benefit of Taiwan application serial no. 96125385, filed on Jul. 12, 2007. The entirety of the above-mentioned patent application is hereby incorporated by reference herein and made a part of this specification.

BACKGROUND OF THE INVENTION

1. Field of the Invention

The present invention relates to an array substrate, and more particularly to an active device array substrate.

2. Description of Related Art

Along with increasing demands of displays, manufacturers in this industry have endeavored to improve the quality of the displays. A cathode ray tube (CRT) display, in particular, has played a dominant role in the display market for years as a result of its extraordinary displaying quality and technical maturity. Compared with other displays, the CRT display not only has the disadvantages of high power consumption and high radiation adverse to environmental protection, but also has larger product volume, which cannot meet the trend of lightness, thinness, shortness, smallness, compactness, and low power consumption in the display market. Hence, a thin film transistor liquid crystal display (TFT-LCD) that features high resolution, efficient space utilization, low power consumption, and no radiation has become the mainstream in the display marketplace.

A TFT-LCD module is mainly composed of a liquid crystal display (LCD) panel and a backlight module. The LCD panel usually includes a thin film transistor array substrate (TFT array substrate), a color filter substrate (CF substrate) and a liquid crystal layer disposed therebetween. On the other hand, the backlight module provides a planar light source for the LCD panel, such that an LCD module is able to perform a display function.

The TFT array substrate may be divided into a display region and a peripheral circuit region. A plurality of pixel units are disposed in array on the display region, and each of the pixel units includes a TFT and a pixel electrode connected to the TFT. Moreover, a plurality of scan lines and a plurality of data lines are disposed on the peripheral circuit region and the display region. The TFT of each of the pixel units is controlled by the corresponding scan line and data line.

To prevent electrostatic discharge (ESD), an ESD protection circuit is often disposed on the peripheral circuit region of the TFT array substrate. The ESD protection circuit includes an outer short ring (OSR) and an inner short ring (ISR). After the entire TFT array substrate is completely fabricated, a cutting process is usually performed to remove the OSR. However, the removal of the OSR leads to a decrease in ESD protection of the TFT array substrate.

SUMMARY OF THE INVENTION

The present invention is directed to an active device array substrate for improving ESD protection.

The present invention provides an active device array substrate including a substrate, a pixel array, a plurality of pads, a plurality of first switching devices, and a plurality of second switching devices. The substrate has a peripheral circuit region and a display region, and the pixel array is disposed on the display region. The pads are disposed on the peripheral circuit region and are electrically connected to the pixel array. The first switching devices are disposed on the peripheral circuit region and located at the outside of the pads. Each of the first switching devices is electrically connected to one of the pads. Besides, each of the first switching devices has a gate, a source and a drain, and the gate is electrically connected to the source and the pad. On the other hand, the second switching devices are disposed on the peripheral circuit region and located at the outside of the pads. Each of the second switching devices is electrically connected to two adjacent first switching devices and has a gate, a source, and a drain. Here, the source is electrically connected to the drain of the adjacent first switching device, while the drain is electrically connected to the source of the adjacent first switching device.

According to an embodiment of the present invention, the gate of each of the second switching devices is a floating gate.

According to an embodiment of the present invention, the gate of each of the second switching devices and the source thereof are electrically connected to each other.

According to an embodiment of the present invention, the active device array substrate further includes a connecting wire disposed on the peripheral circuit region and located at the outside of the first and the second switching devices. The source of each of the second switching devices is electrically connected to the connecting wire, and the gate of each of the second switching devices is a floating gate.

According to an embodiment of the present invention, the pads include data line pads or scan line pads.

The present invention further provides an active device array substrate including a substrate, a pixel array, a plurality of pads, a plurality of first switching devices, and a plurality of second switching devices. The substrate has a peripheral circuit region and a display region, and the pixel array is disposed on the display region. The pads are disposed on the peripheral circuit region and are electrically connected to the pixel array. The first switching devices are disposed on the peripheral circuit region and located at the outside of the pads. Each of the first switching devices is electrically connected to one of the pads. Besides, each of the first switching devices has a gate, a source and a drain. The gate is electrically connected to the source and the pad. The drain is a floating drain. On the other hand, the second switching devices are disposed on the peripheral circuit region and located at the outside of the pads. Each of the second switching devices is electrically connected to one of the first switching devices, and each of the second switching devices has a gate, a source, a drain, and the drain electrically connected to the source of the first switching device. In addition, the source is a floating source, and the gate is a floating gate.

According to an embodiment of the present invention, the pads include data line pads or scan line pads.

Based on the above, the first switching devices and the second switching devices are employed in the present invention for electrically connecting each of the pads. Accordingly, the active device array substrate is equipped with a function of ESD protection. In addition, each of the pads may be electrically isolated from one another, so as to prevent signals from interfering with one another.

In order to the make the aforementioned and other objects, features and advantages of the present invention comprehensible, several embodiments accompanied with figures are described in detail below.

DESCRIPTION OF EMBODIMENTS

First Embodiment

Figure 1A:
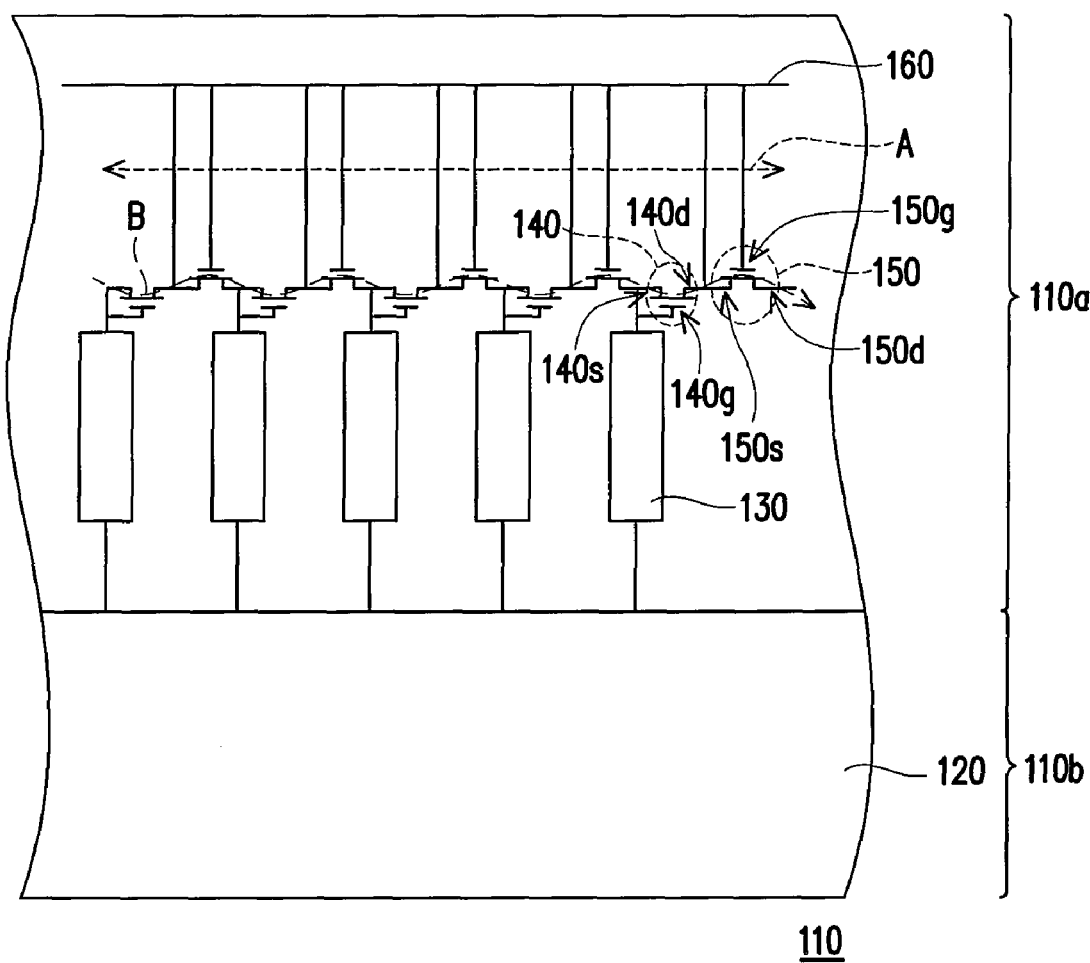
FIG. 1A is an equivalent circuit diagram of an active device array substrate according to a first embodiment of the present invention before a cutting process is performed.
Figure 1B:
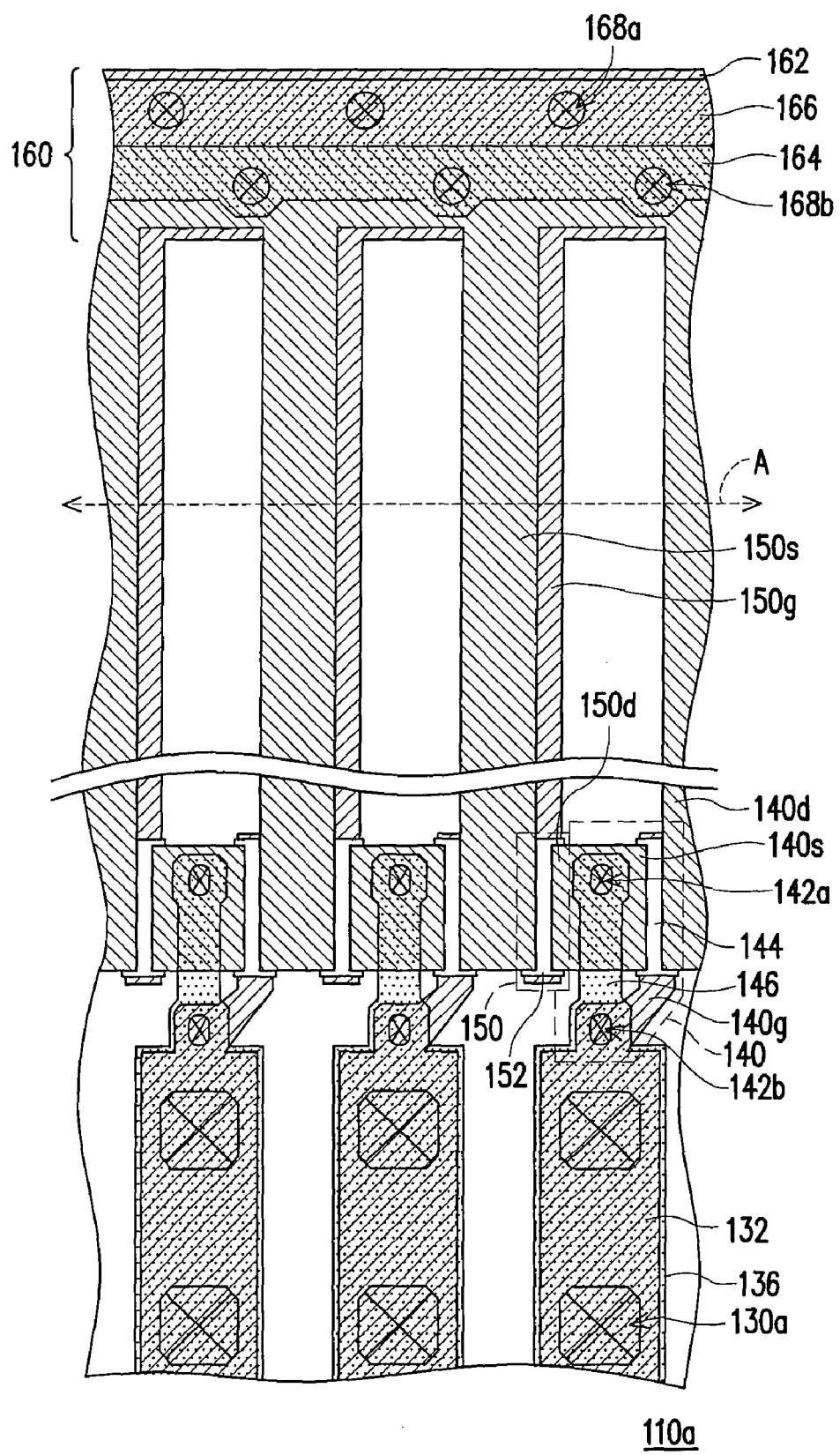
FIG. 1B is a top view of the peripheral circuit region of the active device array substrate according to the first embodiment of the present invention before the cutting process is performed.

FIG. 1A is an equivalent circuit diagram of an active device array substrate according to a first embodiment of the present invention before a cutting process is performed. FIG. 1B is a top view of the active device array substrate according to the first embodiment of the present invention before the cutting process is performed, and no pixel array is illustrated herein.

Referring to FIG. 1A, a method of fabricating the active device array substrate of the present embodiment includes the following steps. First, an active device array substrate 110 having a peripheral circuit region 110a and a display region 110b is provided. A pixel array 120 has already been formed on the display region 110b. The pixel array 120 usually includes a plurality of scan lines, a plurality of data lines, a plurality of TFTs, and a plurality of the pixel electrodes. However, the detailed structure of the pixel array 120 is not depicted herein for the purpose of simplicity. Besides, a plurality of pads 130, a plurality of first switching devices 140, a plurality of second switching devices 150 and an OSR 160 are already formed on the peripheral circuit region 110a. The pads 130 are electrically connected to the pixel array 120, and the pads 130 may be data line pads, scan lines pads or other types of pads.

The first switching devices 140 and the second switching devices 150 are located at the outside of the pads 130, and each of the first switching devices 140 is electrically connected to one of the pads 130. In detail, each of the first switching devices 140 has a gate 140g, a source 140s and a drain 140d, and the gate 140g is electrically connected to the source 140s and the pad 130. That is to say, each of the first switching devices 140 may be regarded as a diode. On the other hand, each of the second switching devices 150 is electrically connected to two adjacent first switching devices 140. In other words, the second switching devices 150 are electrically connected to the first switching devices 140 in series. Hence, when ESD occurs, a current may move along a discharging path B as illustrated in FIG. 1A and is extended to the entire active device array substrate 110, so as to reduce likelihood of damages caused by ESD. Each of the second switching devices 150 has a gate 150g, a source 150s and a drain 150d. Here, the source 150s is electrically connected to the drain 140d of the adjacent first switching device 140, while the drain 150d is electrically connected to the source 140s of the adjacent first switching device 140. In addition, the source 150s of each of the second switching devices 150 and the gate 150g thereof are both electrically connected to the OSR 160.

The explanation of the detailed structure of the active device array substrate is provided as follows. However, note that the structure depicted in the equivalent circuit diagram of FIG. 1A is not limited to the structure illustrated in FIG. 1B. Those of ordinary skill in the technical field of the present invention may think of other structures based on the equivalent circuit diagram of FIG. 1A.

Please refer to FIG. 1B. The detailed structure of the pixel array 120 is not depicted herein for the purpose of simplicity. Each of the pads 130 includes a first metallic layer 132, a transparent conductive layer 136 and a plurality of contact windows 130a. The first metallic layer 132 is disposed on the peripheral circuit region 110a, and the transparent conductive layer 136 is disposed over the first metallic layer 132. In addition, the transparent conductive layer 136 is electrically connected to the first metallic layer 132 through the contact window 130a.

Each of the first switching devices 140 has the gate 140g, the source 140s, the drain 140d, a plurality of contact windows 142a and 142b, a semiconductor layer 144, and a transparent conductive layer 146. The gate 140g is disposed on the peripheral circuit region 110a and electrically connected to the first metallic layer 132 of the pad 130. The semiconductor layer 144 is disposed over the gate 140g, and the source 140s and the drain 140d respectively cover a portion of the semiconductor layer 144. The transparent conductive layer 146 is disposed over a part of the source 140s and a part of the gate 140g. Besides, the transparent conductive layer 146 is electrically connected to the source 140s through the contact window 142a, whereas the transparent conductive layer 146 is electrically connected to the gate 140g through the contact window 142b. Accordingly, the source 140s of the first switching device 140 is electrically connected to the gate 140g through the transparent conductive layer 146. In addition, the drain 140d is electrically connected to the OSR 160.

Each of the second switching devices 150 has the gate 150g, the source 150s, the drain 150d, and a semiconductor layer 152. Here, the gate 150g is disposed on the peripheral circuit region 110a, and the semiconductor layer 152 is disposed over the gate 150g. The source 150s and the drain 150d respectively cover a portion of the semiconductor layer 152. The drain 150d is electrically connected to the source 140s of the first switching device 140, and the source 150s and the gate 150g are both electrically connected to the OSR 160. In addition, the source 150s is electrically connected to the drain 140d of the adjacent first switching device 140. Thus, the second switching devices 150 and the first switching devices 140 are electrically connected to each other in series.

The OSR 160 includes a first metallic layer 162, a second metallic layer 164, a transparent conductive layer 166 and a plurality of contact windows 168a and 168b. The first metallic layer 162 is disposed on the peripheral circuit region 110a and is electrically connected to the gate 150g of the second switching device 150. The second metallic layer 164 is disposed on the peripheral circuit region 110a and covers a portion of the first metallic layer 162. Besides, the source 150s of the second switching device 150 and the drain 140d of the first switching device 140 are both electrically connected to the second metallic layer 164. The transparent conductive layer 166 covers the first metallic layer 162 and the second metallic layer 164. In addition, the transparent conductive layer 166 is electrically connected to the first metallic layer 162 through the contact window 168a, while the transparent conductive layer 166 is electrically connected to the second metallic layer 164 through the contact window 168b.

Referring to FIGS. 1A and 1B, a cutting process is then performed along a cutting line A, so as to remove the OSR 160. An active device array substrate 110 is then completely fabricated.

Figure 2A:
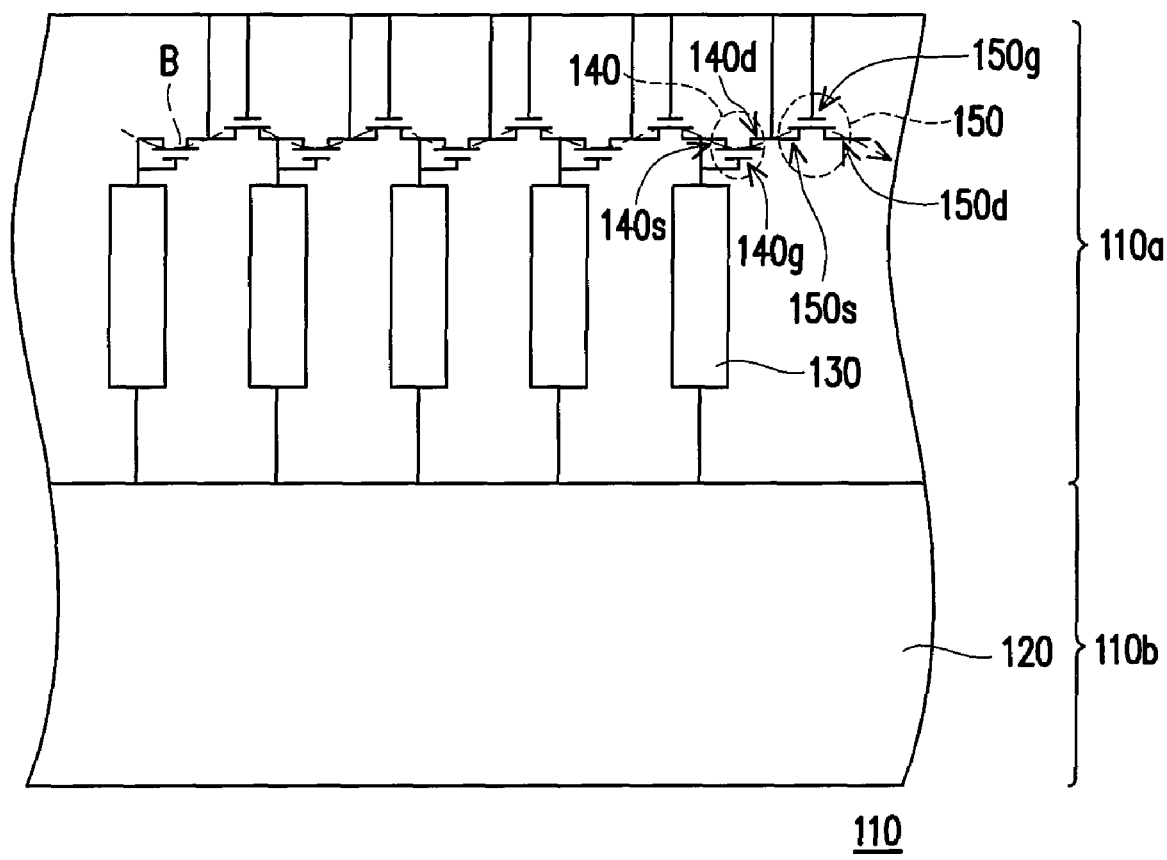
FIG. 2A is an equivalent circuit diagram of the active device array substrate according to the first embodiment of the present invention.
Figure 2B:
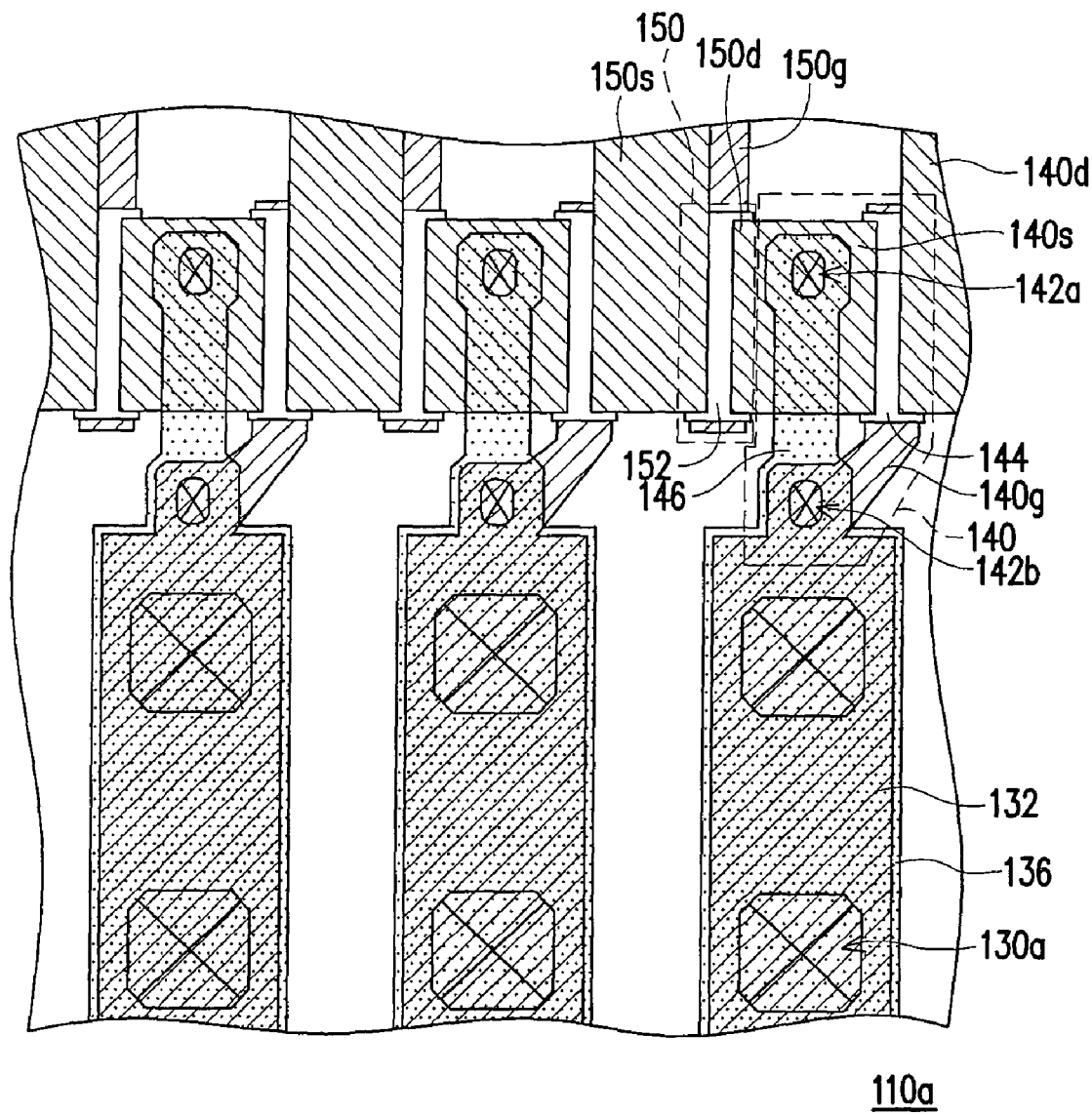
FIG. 2B is a top view of the peripheral circuit region of the active device array substrate according to the first embodiment of the present invention.

FIG. 2A is an equivalent circuit diagram of the active device array substrate according to the first embodiment of the present invention. FIG. 2B is a top view of the peripheral circuit region of the active device array substrate according to the first embodiment of the present invention. Referring to FIGS. 2A and 2B, after the cutting process is implemented, the gate 150g of each of the second switching devices 150 becomes a floating gate. Namely, the gate 150g is not electrically connected to any circuit. The pads 130 are electrically connected to one another through the first switching devices 140 and the second switching devices 150. Hence, as ESD occurs, the current may move along the discharging path B as illustrated in FIG. 2A and is extended to the entire active device array substrate 110, so as to reduce likelihood of ESD. In other words, the active device array substrate 110 is equipped with the function of ESD protection.

Second Embodiment

Figure 3A:
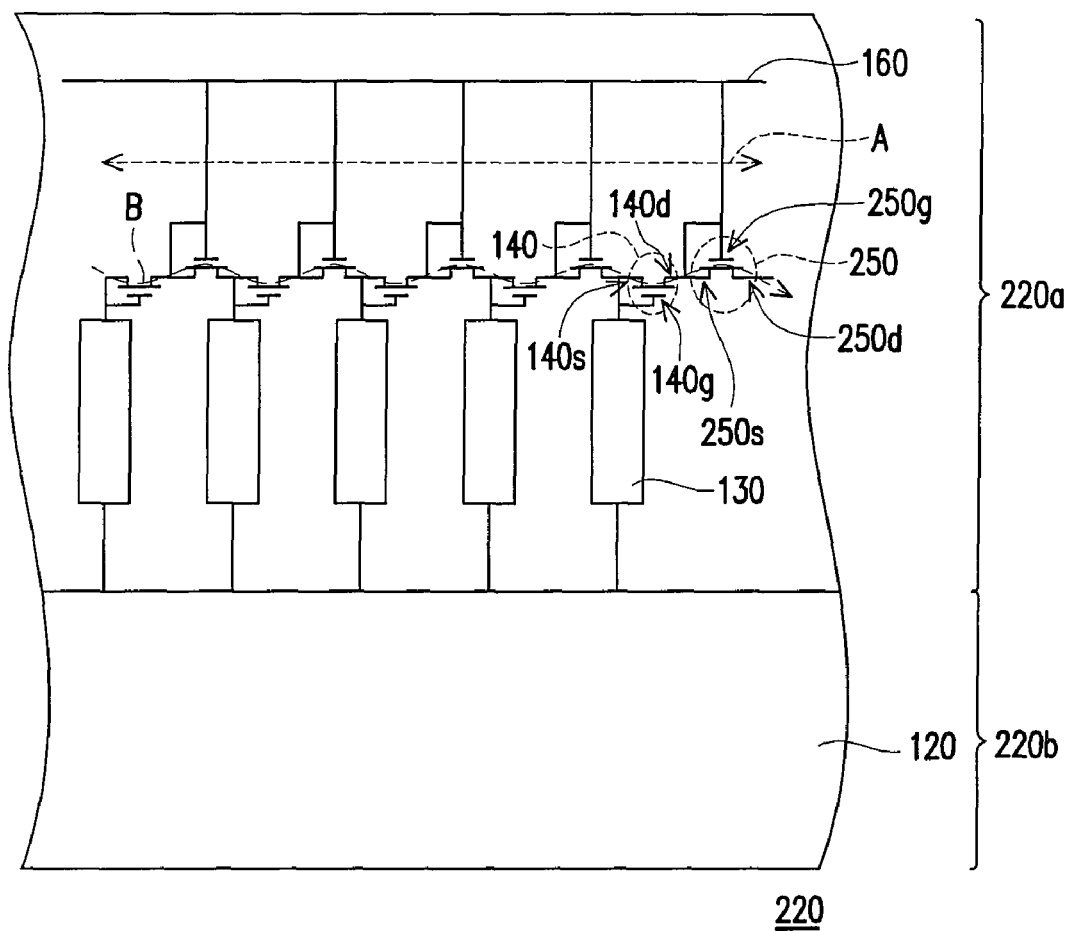
FIG. 3A is an equivalent circuit diagram of an active device array substrate according to a second embodiment of the present invention before a cutting process is performed.
Figure 3B:
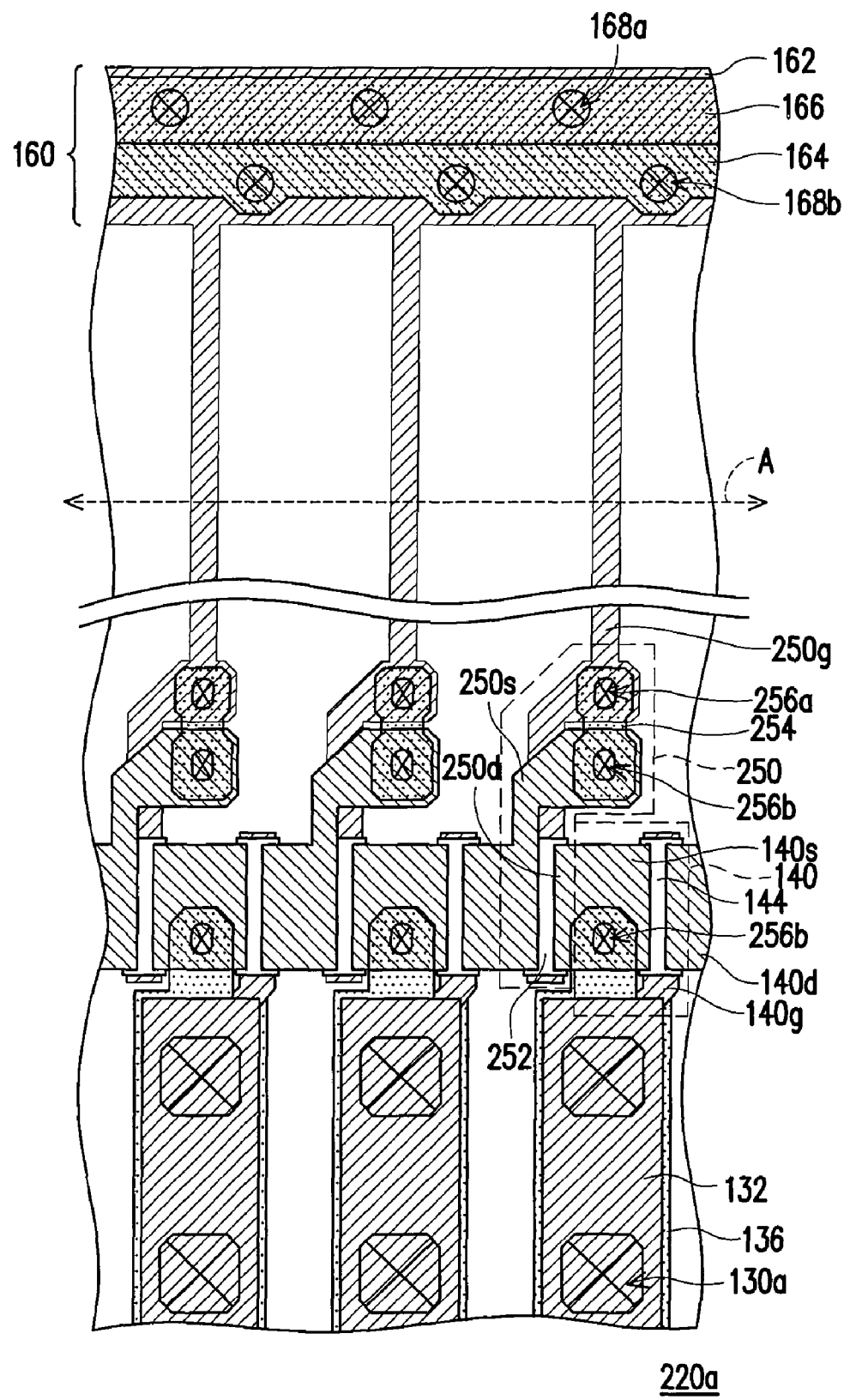
FIG. 3B is a top view of the peripheral circuit region of the active device array substrate according to the second embodiment of the present invention before the cutting process is performed.

FIG. 3A is an equivalent circuit diagram of an active device array substrate according to a second embodiment of the present invention before a cutting process is performed. FIG. 3B is a top view of the peripheral circuit region of the active device array substrate according to the second embodiment of the present invention before the cutting process is performed. Please refer to FIG. 3A. The present embodiment is similar to the first embodiment, while the difference therebetween lies in that a gate 250g of each of second switching devices 250 and a source 250s thereof are electrically connected to each other. Thus, each of the second switching devices 250 may be regarded as a diode. In addition, a drain 250d of the second switching device 250 is electrically connected to the source 140s of the first switching device 140.

The explanation of the detailed structure of the active device array substrate is provided as follows. However, note that the structure depicted in the equivalent circuit diagram of FIG. 3A is not limited to the structure illustrated in FIG. 3B. Those of ordinary skill in the technical field of the present invention may think of other structures based on the equivalent circuit diagram of FIG. 3A.

Please refer to FIG. 3B. More particularly, each of the second switching devices 250 has the gate 250g, the source 250s, the drain 250d, a semiconductor layer 252, a transparent conductive layer 254, and a plurality of contact windows 256a and 256b. The gate 250g is disposed on the peripheral circuit region 220a of the active device array substrate 220 and electrically connected to the first metallic layer 162 of the OSR 160. The semiconductor layer 252 is disposed over the gate 250g. The source 250s and the drain 250d respectively cover a portion of the semiconductor layer 252. Additionally, in the present embodiment, the source 250s further crosses over the gate 250g, and the transparent conductive layer 254 covers a part of the source 250s and a part of the gate 250g. The transparent conductive layer 254 is electrically connected to the gate 250g though the contact window 256a, whereas the transparent conductive layer 254 is electrically connected to the source 250s through the contact window 256b. The second switching devices 250 are electrically connected to the first switching devices 140 in series. Hence, when ESD occurs, the current may move along the discharging path B and is extended to the entire active device array substrate 220, so as to reduce likelihood of ESD.

Referring to FIGS. 3A and 3B, the cutting process is then performed along the cutting line A, so as to remove the OSR 160. An active device array substrate 220 is then completely fabricated.

Figure 4A:
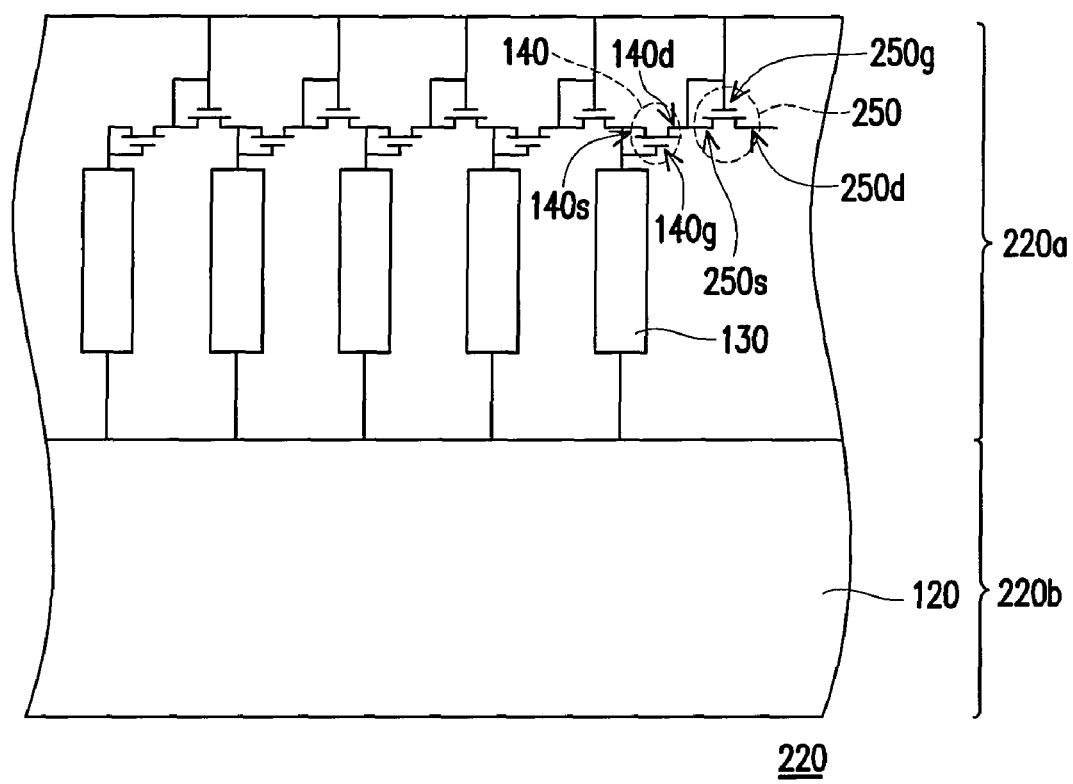
FIG. 4A is an equivalent circuit diagram of the active device array substrate according to the second embodiment of the present invention.
Figure 4B:
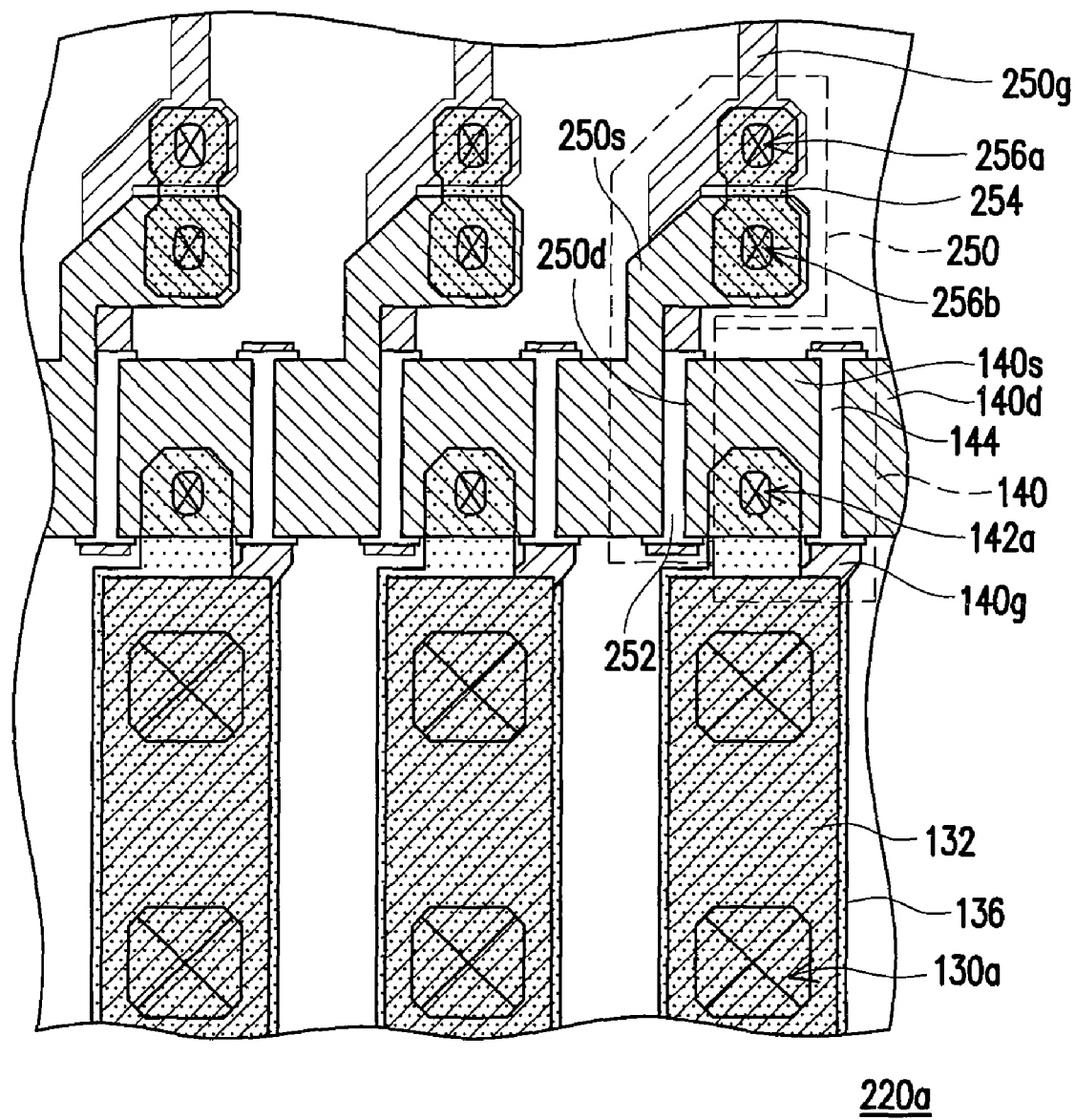
FIG. 4B is a top view of the peripheral circuit region of the active device array substrate according to the second embodiment of the present invention.

FIG. 4A is an equivalent circuit diagram of the active device array substrate according to the second embodiment of the present invention. FIG. 4B is a top view of the peripheral circuit region of the active device array substrate according to the second embodiment of the present invention. Referring to FIGS. 4A and 4B, after the cutting process is implemented, the gate 250g of each of the second switching devices 250 is cut off. Besides, the gate 250g of each of the second switching devices 250 and the source 250s thereof are electrically connected to each other. That is to say, in the present embodiment, each of the second switching devices 250 and each of the first switching devices 140 can be regarded as two diodes electrically connected to each other in series. The pads 130 are electrically connected to one another through the first switching devices 140 and the second switching devices 250. Hence, as ESD occurs, the current may move along the discharging path B and is extended to the entire active device array substrate 220, so as to reduce likelihood of ESD. In other words, the active device array substrate 220 is equipped with the function of ESD protection. Moreover, only the gate 250g of each of the second switching devices 250 is cut off through the cutting process. Thus, short circuit arisen from metal pieces produced by the cutting process is reduced.

Third Embodiment

Figure 5A:
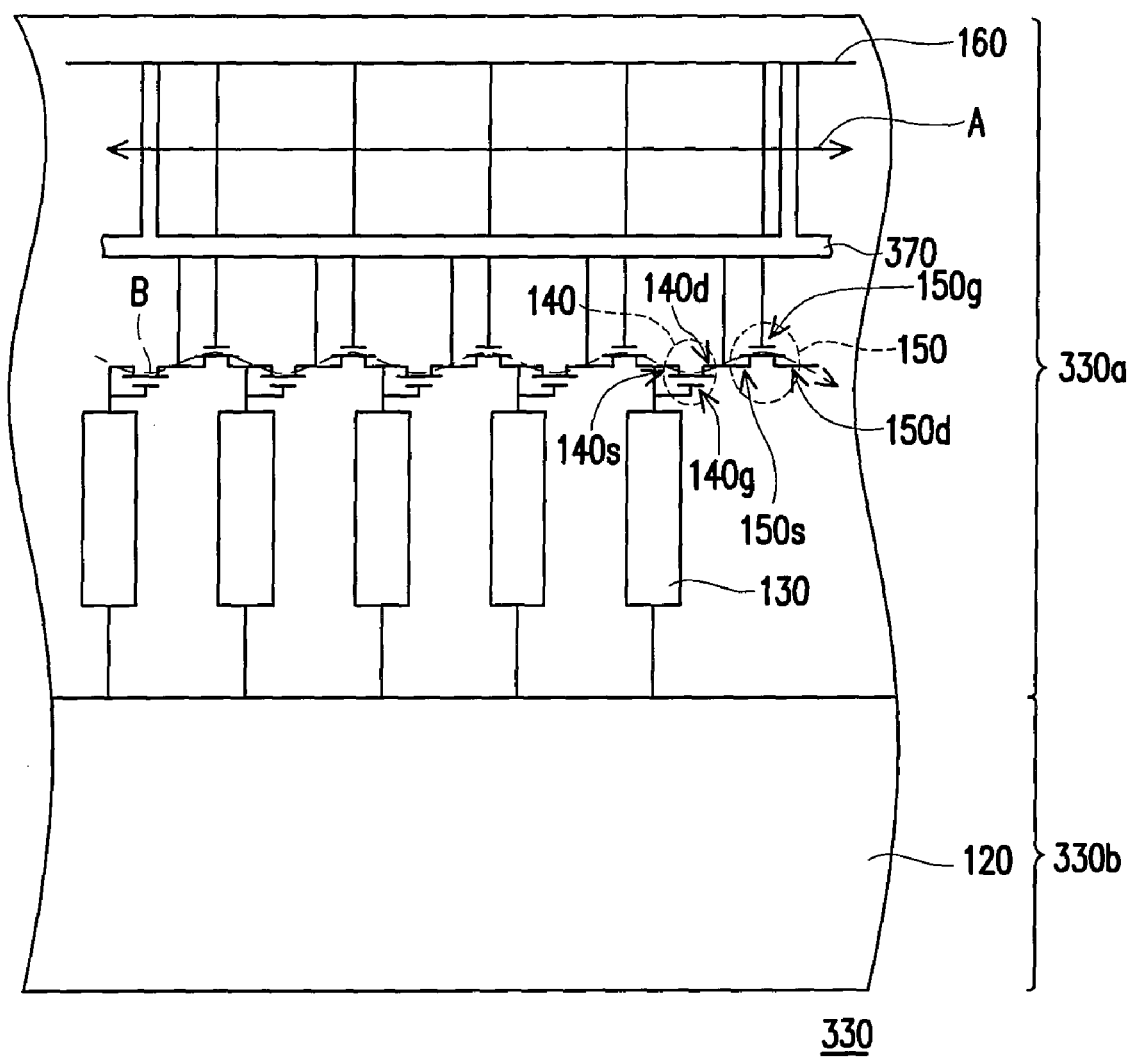
FIG. 5A is an equivalent circuit diagram of an active device array substrate according to a third embodiment of the present invention before a cutting process is performed.
Figure 5B:
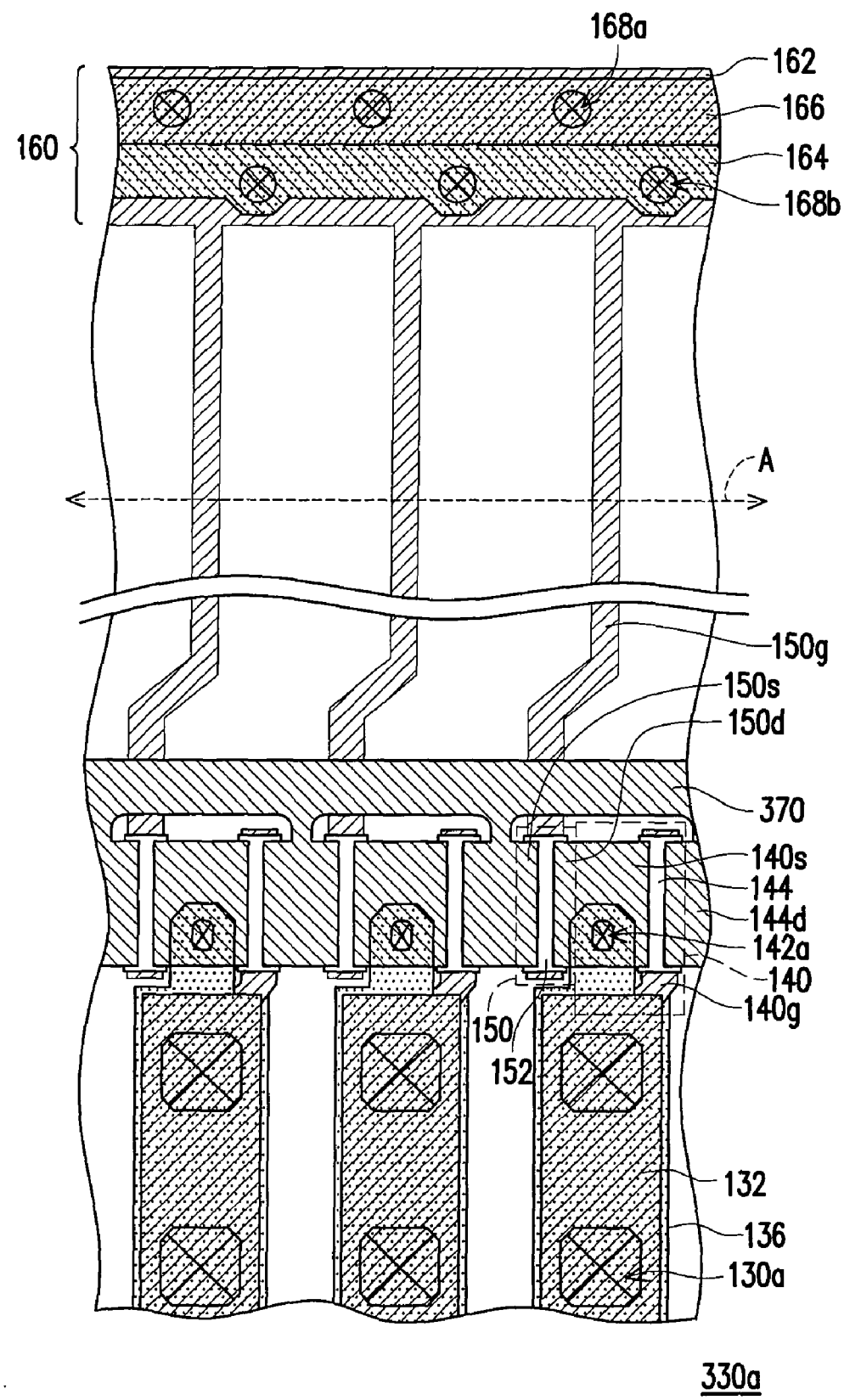
FIG. 5B is a top view of the peripheral circuit region of the active device array substrate according to the third embodiment of the present invention before the cutting process is performed.

FIG. 5A is an equivalent circuit diagram of an active device array substrate according to a third embodiment of the present invention before a cutting process is performed. FIG. 5B is a top view of the peripheral circuit region of the active device array substrate according to the third embodiment of the present invention before the cutting process is performed. Please refer to FIG. 5A. The present embodiment is similar to the first embodiment, but the difference therebetween lies in that a connecting wire 370 is further formed on the peripheral circuit region 330a of the active device array substrate 330. The connecting wire 370 is disposed at the outside of the first switching devices 140 and the second switching devices 150. Besides, the source 150s of each of the second switching devices 150 is electrically connected to the connecting wire 370.

The explanation of the detailed structure of the active device array substrate is provided as follows. However, note that the structure depicted in the equivalent circuit diagram of FIG. 5A is not limited to the structure illustrated in FIG. 5B. Those of ordinary skill in the technical field of the present invention may think of other structures based on the equivalent circuit diagram of FIG. 5A.

Please refer to FIG. 5B. More particularly, the connecting wire 370 is disposed on the peripheral circuit region 330a and is located at the outside of the first switching devices 140 and the second switching devices 150. Besides, the connecting wire 370 crosses over the gate 150 of each of the second switching devices 150, and the source 150s of each of the second switching devices 150 is electrically connected to the connecting wire 370. The second switching devices 150 are electrically connected to the first switching devices 140 in series. Hence, when ESD occurs, the current may move along the discharging path B and is extended to the entire active device array substrate 330, so as to reduce likelihood of ESD. In addition, the connecting wire 370 is also conductive to prevent ESD.

Referring to FIGS. 5A and 5B, the cutting process is then performed along the cutting line A, so as to remove the OSR 160. An active device array substrate 330 is then completely fabricated.

Figure 6A:
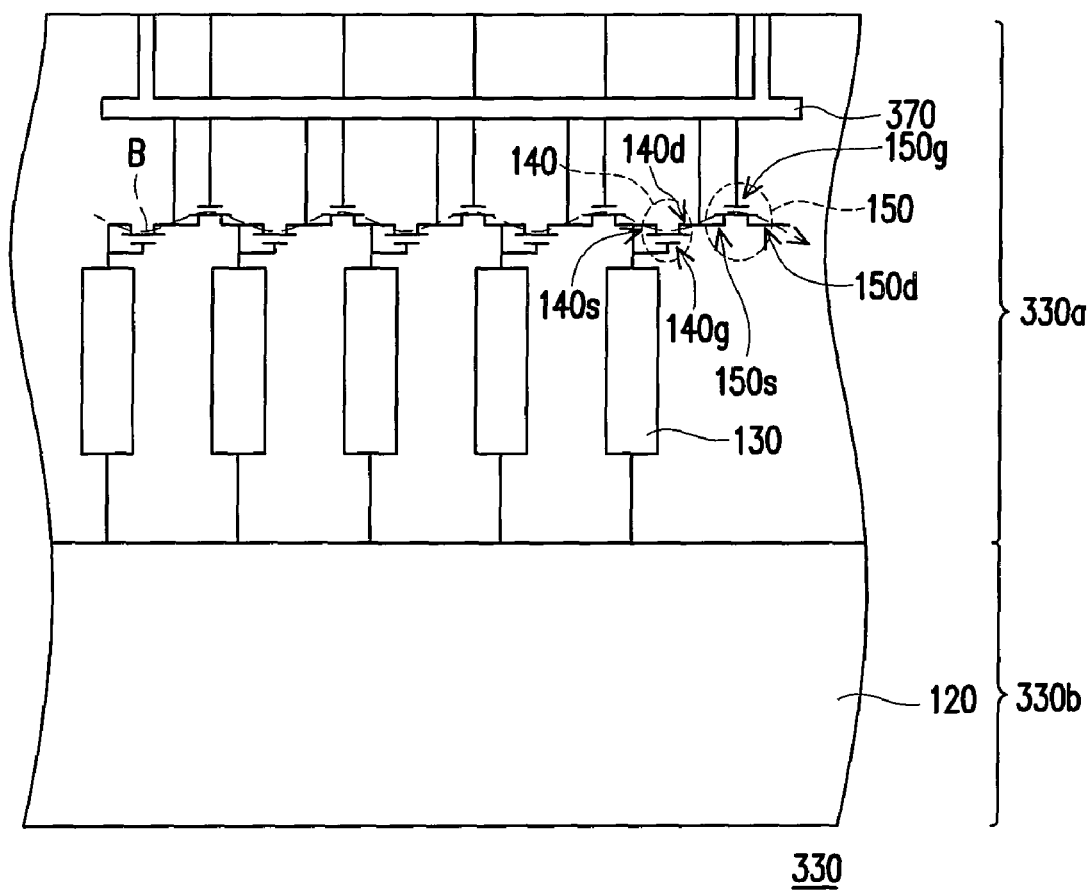
FIG. 6A is an equivalent circuit diagram of the active device array substrate according to the third embodiment of the present invention.
Figure 6B:
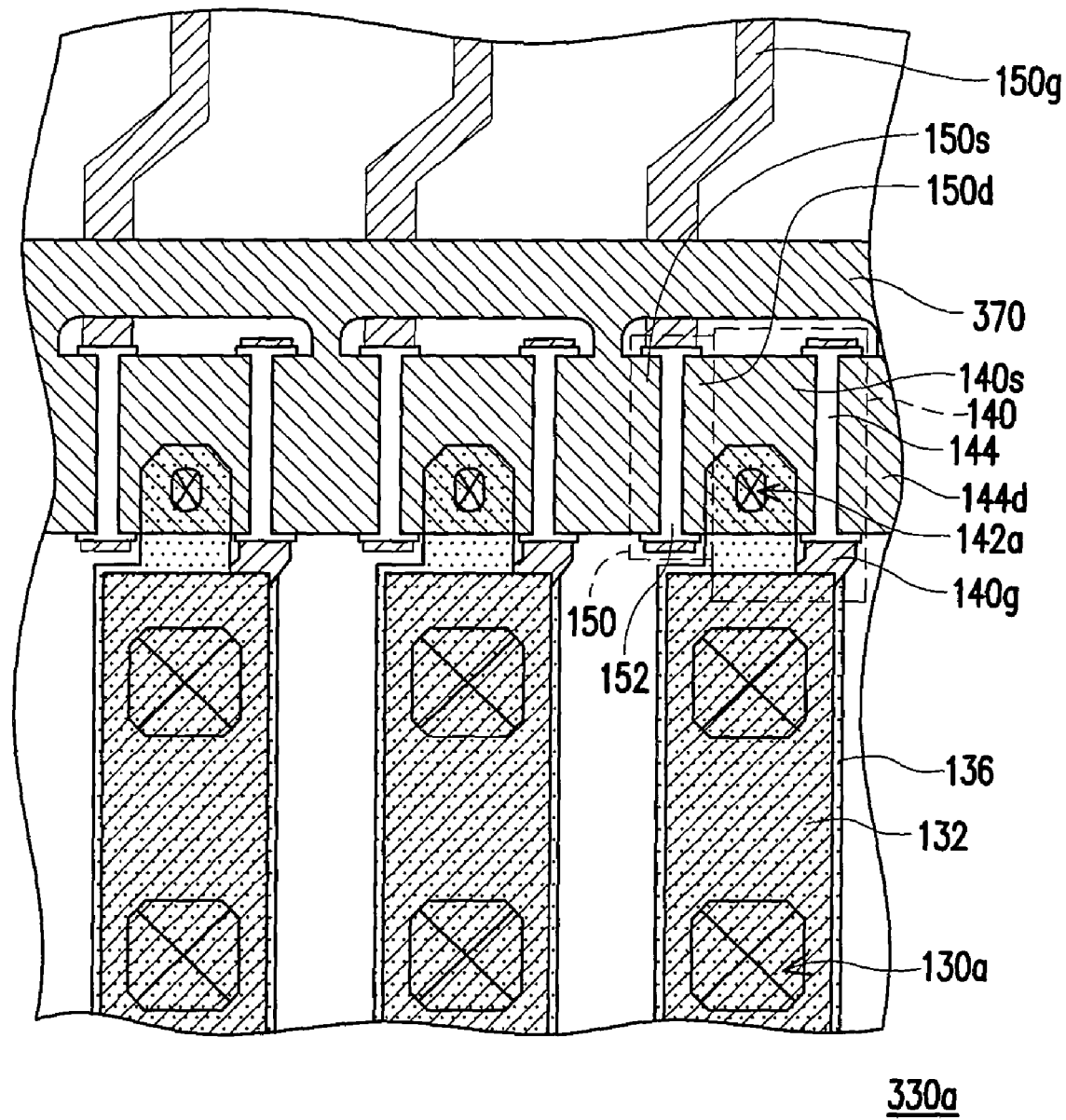
FIG. 6B is a top view of the peripheral circuit region of the active device array substrate according to the third embodiment of the present invention.

FIG. 6A is an equivalent circuit diagram of the active device array substrate according to the third embodiment of the present invention. FIG. 6B is a top view of the peripheral circuit region of the active device array substrate according to the third embodiment of the present invention. Referring to FIGS. 6A and 6B, after the cutting process is implemented, the gate 150g of each of the second switching devices 150 becomes a floating gate. Namely, the gate 150g is not electrically connected to any circuit.

The pads 130 are electrically connected to one another through the first switching devices 140 and the second switching devices 150. Further, the sources 150s of the second switching devices 150 are electrically connected to one another in parallel. Hence, as ESD occurs, the current may move along the discharging path B and the connecting wire 370 and is extended to the entire active device array substrate 330, so as to reduce likelihood of ESD. In other words, the active device array substrate 330 has favorable ESD protection. Moreover, only the gate 150g of each of the second switching devices 150 is cut off through the cutting process. Thus, short circuit arisen from metal pieces produced by the cutting process is reduced.

Fourth Embodiment

Figure 7A:
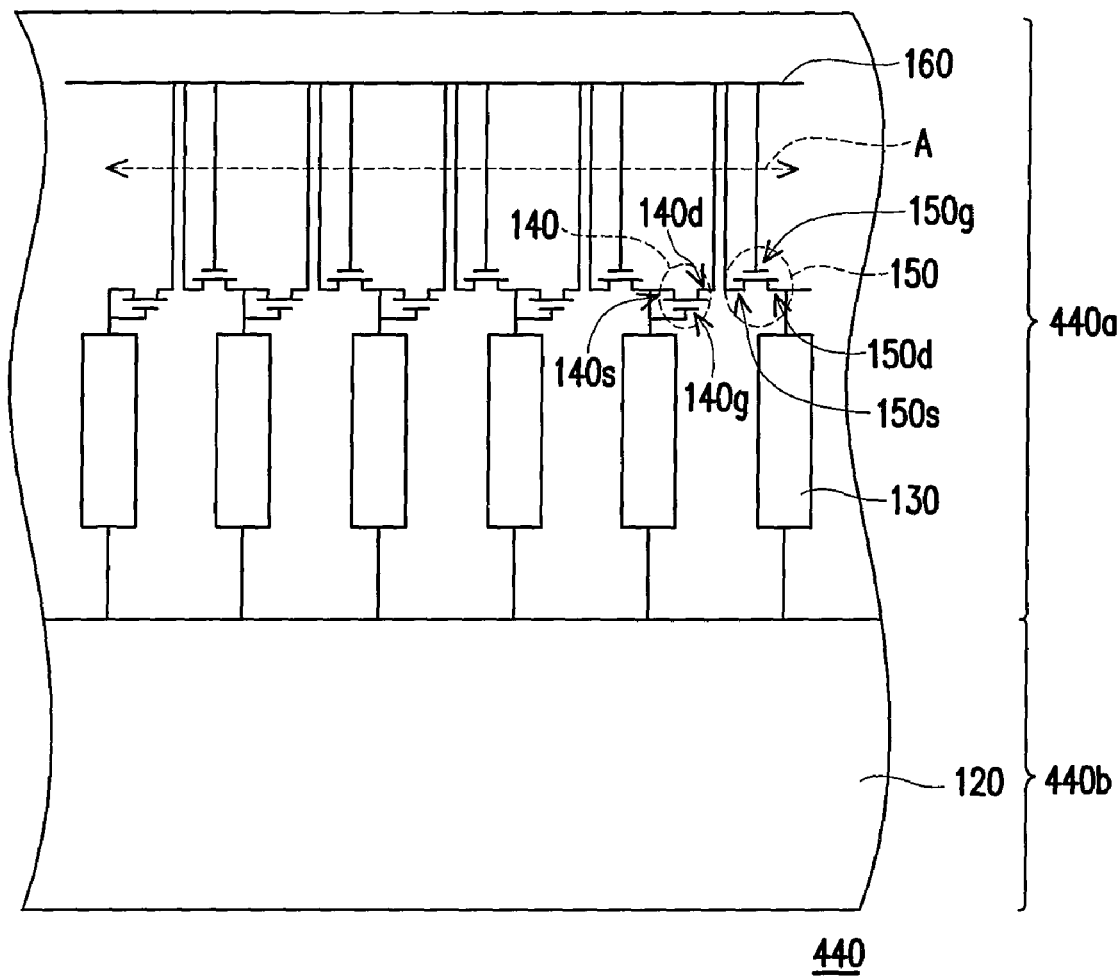
FIG. 7A is an equivalent circuit diagram of an active device array substrate according to a fourth embodiment of the present invention before a cutting process is performed.
Figure 7B:
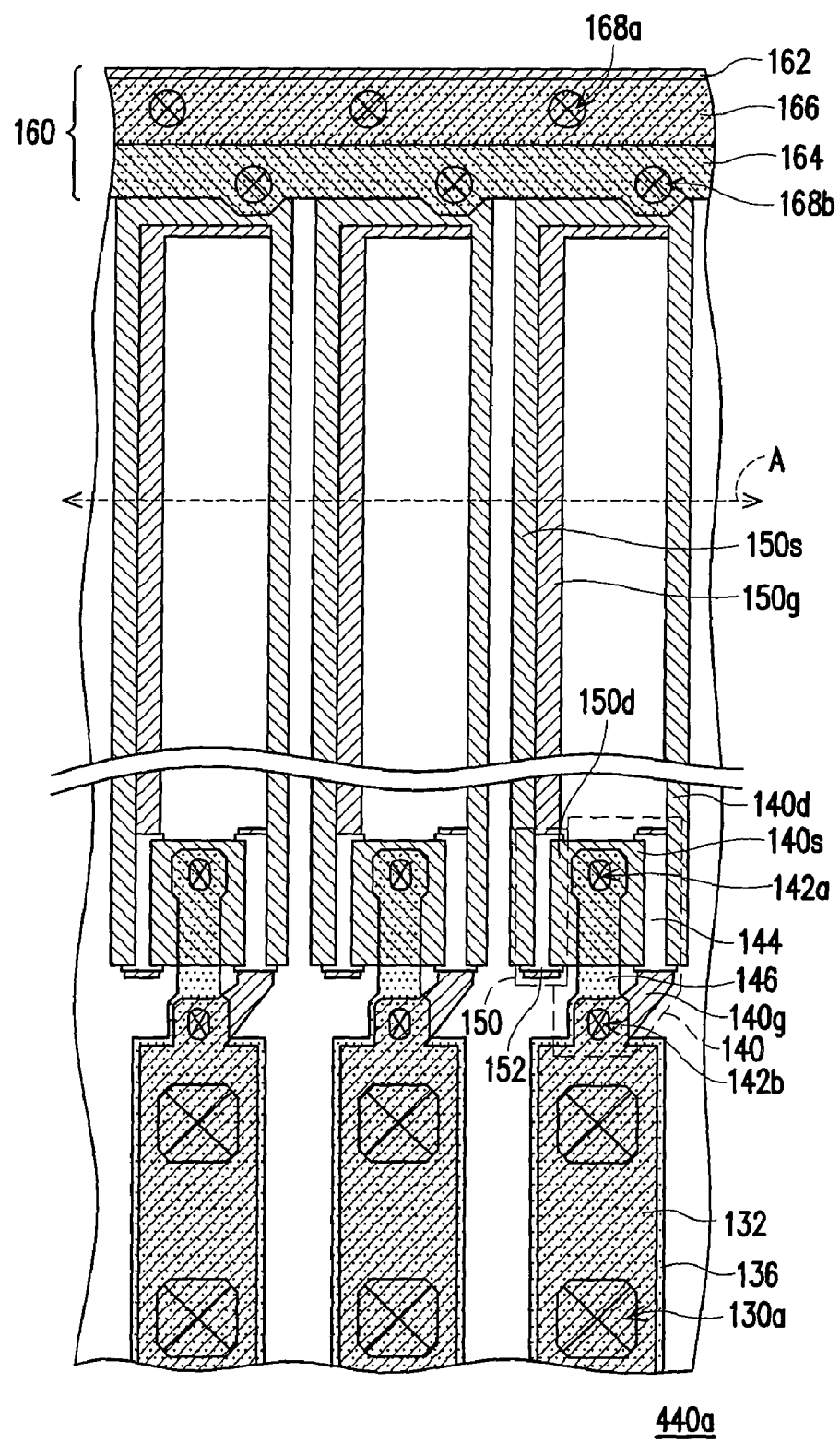
FIG. 7B is a top view of the peripheral circuit region of the active device array substrate according to the fourth embodiment of the present invention before the cutting process is performed.

FIG. 7A is an equivalent circuit diagram of an active device array substrate according to a fourth embodiment of the present invention before a cutting process is performed. FIG. 7B is a top view of the peripheral circuit region of the active device array substrate according to the fourth embodiment of the present invention before the cutting process is performed. Please refer to FIG. 7A. The present embodiment is similar to the first embodiment, but the difference therebetween lies in that the drain 140d of each of the first switching devices 140 is directly connected to the OSR 160, and so is the source 150s of each of the second switching devices 150. That is to say, in comparison with the first embodiment, the drain 140d of each of the first switching devices 140 and the source 150s of each of the second switching devices 150 are individually connected to the OSR 160. In addition, the drain 140d of the first switching device 140 is separated from the source 150s of the second switching device 150.

The explanation of the detailed structure of the active device array substrate is provided as follows. However, note that the structure depicted in the equivalent circuit diagram of FIG. 7A is not limited to the structure illustrated in FIG. 7B. Those of ordinary skill in the technical field of the present invention may think of other structures based on the equivalent circuit diagram of FIG. 7A.

Please refer to FIG. 7B. More particularly, the source 150s of the second switching device 150 covers a part of the gate 150g and is directly connected to the second metallic layer 164 of the OSR 160. Besides, the drain 140d of the first switching device 140 is directly connected to the second metallic layer 164 of the OSR 160 as well.

Referring to FIGS. 7A and 7B, the cutting process is then performed along the cutting line A, so as to remove the OSR 160. An active device array substrate 440 is then completely fabricated.

Figure 8A:
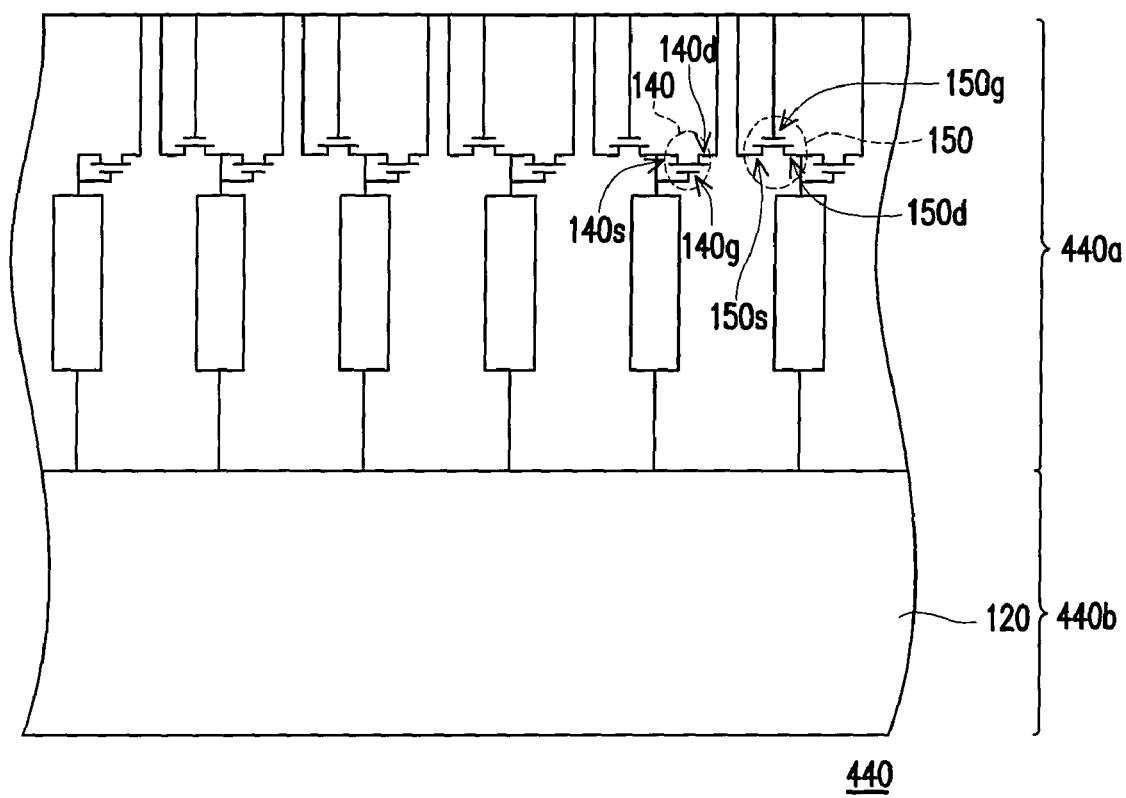
FIG. 8A is an equivalent circuit diagram of the active device array substrate according to the fourth embodiment of the present invention.
Figure 8B:
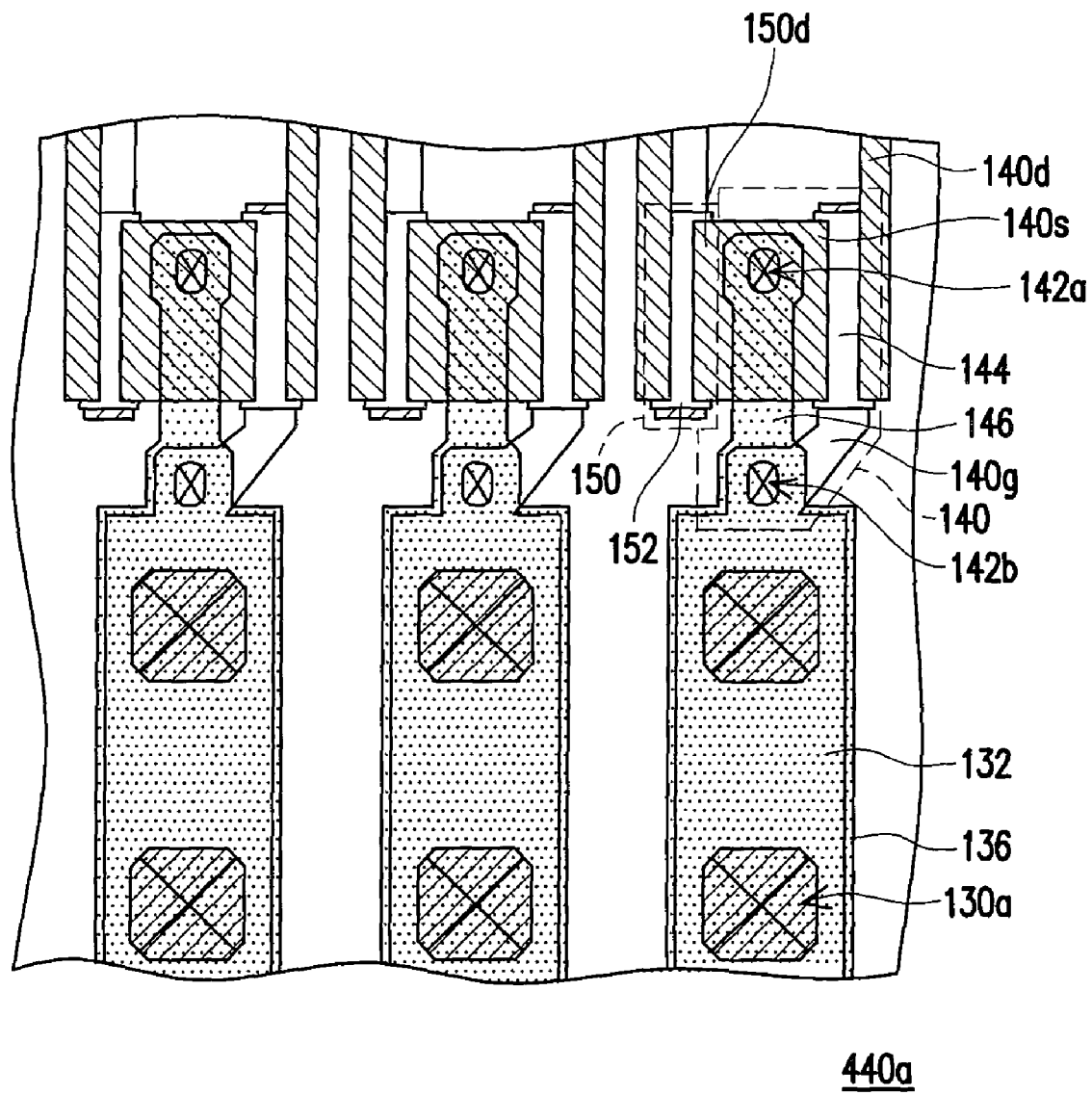
FIG. 8B is a top view of the peripheral circuit region of the active device array substrate according to the fourth embodiment of the present invention.

FIG. 8A is an equivalent circuit diagram of the active device array substrate according to the fourth embodiment of the present invention. FIG. 8B is a top view of the peripheral circuit region of the active device array substrate according to the fourth embodiment of the present invention. Referring to FIGS. 8A and 8B, after the cutting process is implemented, the gate 150g of each of the second switching devices 150 and the source 150s thereof are cut off. Thus, the gate 150g of each of the second switching devices 150 becomes a floating gate, and the source 150s thereof also becomes a floating source. Namely, the gate 150g and the source 150s are not electrically connected to any circuit. In addition, the drain 140d of the first switching device 140 is also cut off, and thus the drain 140d of the first switching device 140 becomes a floating drain as well. Likewise, the drain 140d is not electrically connected to any circuit. In view of the foregoing, the pads 130 of the active device array substrate 440 are electrically insulated from one another, so as to reduce the possibility of signal interference.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. An active device array substrate having protecting electrostatic discharge circuits, comprising:
   a substrate, having a peripheral circuit region and a display region;
   a pixel array disposed on the display region;
   a plurality of pads disposed on the peripheral circuit region and electrically connected to the pixel array;
   a plurality of first switching devices disposed on the peripheral circuit region and located at the outside of the pads, each of the first switching devices being electrically connected to one of the pads, wherein each of the first switching devices has a gate, a source and a drain, and the gate is electrically connected to the source and the pad; and
   a plurality of second switching devices disposed on the peripheral circuit region and located at the outside of the pads, each of the second switching devices being electrically connected to two adjacent first switching devices with the sources or the drains of the two adjacent first switching devices, wherein each of the second switching devices has a gate, a source and a drain, the first switching devices and the second switching devices are linearly connected to one after another, through the source of each of the second switching device electrically and directly connected to the drain of the adjacent first switching device and the drain of each of the second switching device electrically and directly connected to the source of the adjacent first switching device respectively, so as to have the protecting electrostatic discharge circuits.

2. The active device array substrate having protecting electrostatic discharge circuits according to claim 1, wherein after a cutting process of removing an outer short ring, the gate of each of the second switching devices is a floating gate.

3. The active device array substrate having protecting electrostatic discharge circuits according to claim 1, wherein before a cutting process of removing an outer short ring, the gate of each of the second switching devices and the source thereof are electrically connected to each other.

4. The active device array substrate having protecting electrostatic discharge circuits according to claim 1, wherein the pads comprise data line pads or scan line pads.

* * * * *